United States Patent
Nagaishi

(10) Patent No.: US 11,202,400 B2
(45) Date of Patent: Dec. 14, 2021

(54) RECOGNITION DEVICE

(71) Applicant: FUJI CORPORATION, Chiryu (JP)

(72) Inventor: Takuya Nagaishi, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 372 days.

(21) Appl. No.: 16/328,461

(22) PCT Filed: Sep. 7, 2016

(86) PCT No.: PCT/JP2016/076283
§ 371 (c)(1),
(2) Date: Feb. 26, 2019

(87) PCT Pub. No.: WO2018/047252
PCT Pub. Date: Mar. 15, 2018

(65) Prior Publication Data
US 2021/0161044 A1 May 27, 2021

(51) Int. Cl.
*G03B 7/091* (2021.01)
*G06T 7/73* (2017.01)
(Continued)

(52) U.S. Cl.
CPC ......... *H05K 13/0813* (2018.08); *G03B 7/091* (2013.01); *G06T 7/73* (2017.01);
(Continued)

(58) Field of Classification Search
None
See application file for complete search history.

(56) References Cited

U.S. PATENT DOCUMENTS

2005/0103753 A1   5/2005   Watanabe et al.
2009/0316009 A1 * 12/2009   Ito .......................... H04N 5/243
                                                        348/208.4
(Continued)

FOREIGN PATENT DOCUMENTS

EP   2 998 728 A1   3/2016
JP   6-83945 A      3/1994
JP   2006-210513 A  8/2006

OTHER PUBLICATIONS

Extended European Search Report dated Aug. 26, 2019 in European Patent Application No. 16915671.8, 10 pages.
(Continued)

*Primary Examiner* — Patricia I Young
(74) *Attorney, Agent, or Firm* — Oblon, McClelland, Maier & Neustadt, L.L.P.

(57) ABSTRACT

A recognition device includes an imaging device that images a tip of the lead of a lead component multiple times at different shutter speeds, and multiple pieces of captured image data corresponding to the multiple times of imaging are generated. Then, it is determined whether the tip position of the lead is recognizable based on each of the multiple pieces of captured image data, and a shutter speed between the fastest shutter speed and the slowest shutter speed among the shutter speeds at the time of imaging according to the pieces of captured image data, which are determined to be recognizable, is determined as the optimum shutter speed. By determining the optimum shutter speed in this manner, the exposure light amount at the time of imaging can be stabilized regardless of the shape of the tip of the lead, and the tip position of the lead can be appropriately recognized.

6 Claims, 13 Drawing Sheets

(51) Int. Cl.
*G06T 7/80* (2017.01)
*H05K 13/08* (2006.01)
*H04N 5/225* (2006.01)
*H04N 5/235* (2006.01)

(52) U.S. Cl.
CPC ............ *G06T 7/80* (2017.01); *H04N 5/2256* (2013.01); *H04N 5/2352* (2013.01); *H04N 5/2356* (2013.01); *G06T 2207/10144* (2013.01); *G06T 2207/30141* (2013.01)

(56) References Cited

U.S. PATENT DOCUMENTS

2013/0076895 A1* 3/2013 Aoki ................. G01B 11/2513
348/136
2016/0100089 A1 4/2016 Nozawa

OTHER PUBLICATIONS

International Search Report dated Nov. 29, 2016, in PCT/JP2016/076283 filed on Sep. 7, 2016.

* cited by examiner

RECOGNITION DEVICE

TECHNICAL FIELD

The present application relates to a recognition device for recognizing the position of the characteristic section of a component to be mounted on a board.

BACKGROUND ART

In order to mount a component on a board, it is necessary to appropriately recognize the position of the characteristic section of the component, specifically, for example, a protruding section such as an electrode of the component. For this reason, in a component mounting machine that mounts a component on a board, the component is imaged, and a recognition process to recognize the position of the protruding section of the component is performed based on the captured image data. In detail, light is irradiated from a light source onto a protruding section of the component, and the image of the protruding section of the component is captured based on the light irradiated on the protruding section. Then, based on the captured image data, the recognition process of the position of the protruding section of the component is performed. Various image capturing techniques for components are described in the following patent literature.
Patent literature 1: JP-A-2006-210531
Patent literature 2: JP-A-6-83945

BRIEF DESCRIPTION TECHNICAL PROBLEM

According to the technique described in the above-mentioned Patent Literatures, it is possible to recognize the position of a protruding section of a component to some extent. However, for example, when light irradiated from a light source is reflected off a protruding section, the amount of light reflected may differ depending on the shape of the protruding section of the component. In such a case, since the amount of light reflected changes according to the shape of the protruding section, the exposure light amount at the time of imaging is not stable, and there is a fear that the position of the protruding section cannot be properly recognized. The present disclosure has been made in view of such circumstances, and an object of the present disclosure is to appropriately recognize the position of a characteristic section of a component regardless of the protruding section, that is, the shape or the like of the characteristic section of the component.

Solution to Problem

In order to solve the above problem, a recognition device of the present disclosure is for recognizing a position of a characteristic section of a component to be mounted on a board, the recognition device including: a light source configured to irradiate light on the characteristic section of the component; an imaging device configure to image the characteristic section of the component based on the irradiated light when light from the light source is irradiated on the characteristic section of the component; and a data analysis device configured to recognize a position of the characteristic section of the component imaged by the imaging device based on captured image data imaged by the imaging device, wherein the data analysis device further comprises: a first generating section configured to image the characteristic section of a target component that is an imaging target of the imaging device multiple times at different shutter speeds using the imaging device, in a state in which the target component is located at an imaging position set in advance, and configured to generate multiple pieces of captured image data corresponding to the multiple imagings; a first determining section configured to determine whether the position of the characteristic section of the target component is recognizable based on each of the multiple pieces of captured image data generated by the first generating section; and a first deciding section configured to decide, as an optimum shutter speed, a shutter speed between a first shutter speed, which is a fastest shutter speed among the shutter speeds during imaging corresponding to the captured image data for which the first determining section determined that the position of the characteristic section of the target component was recognizable, and a second shutter speed, which is a slowest shutter speed among the shutter speeds during imaging corresponding to the captured image data for which the first determining section determined that the position of the characteristic section of the target component was recognizable.

Advantageous Effects

In the recognition device of the present disclosure, in a state in which a target component, which is an imaging target, is positioned at a preset imaging position, the characteristic section of the target component is imaged by the imaging device multiple times at different shutter speeds, and multiple pieces of captured image data corresponding to the multiple imagings are generated. Then, it is determined whether the position of the characteristic section of the target component is recognizable based on each of the multiple pieces of captured image data, and a shutter speed between the fastest shutter speed and the slowest shutter speed among the shutter speeds during imaging corresponding to the pieces of captured image data, which are determined to be viable for recognizing the position of the characteristic section, is determined as the optimum shutter speed. By determining the optimum shutter speed in this manner, the exposure light amount during imaging can be stabilized regardless of the shape of the characteristic section, and the position of the characteristic section can be appropriately recognized.

DESCRIPTION OF EMBODIMENTS

Hereinafter, embodiments of the present disclosure will be described in detail with reference to the drawings.

Configuration of Component Mounting Machine

Figure 1:
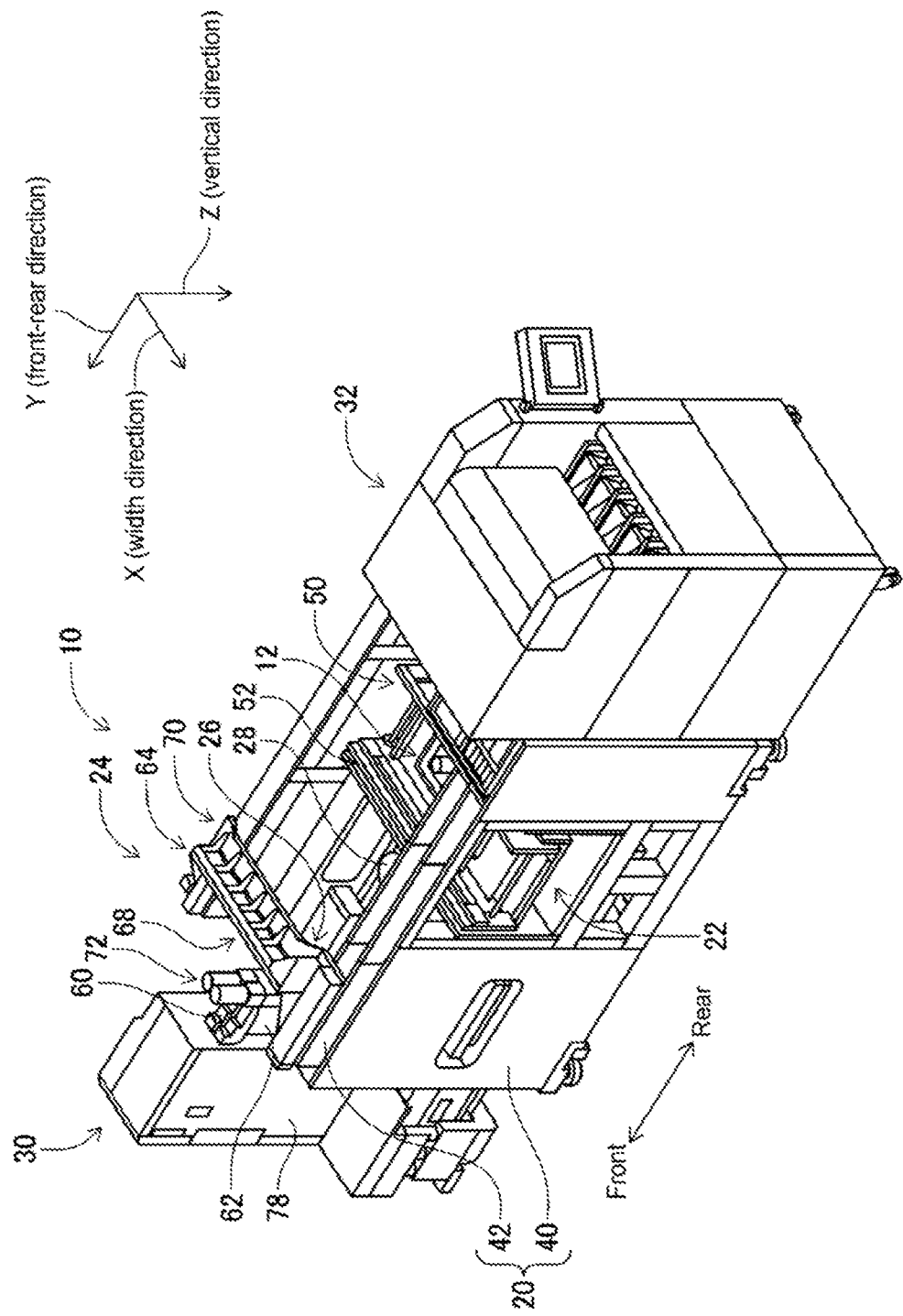
FIG. 1 is a perspective view showing a component mounting machine.

FIG. 1 shows component mounting machine 10. Component mounting machine 10 is a device for performing a mounting operation of components on circuit substrate 12. Component mounting machine 10 includes device main body 20, substrate conveyance and holding device 22, component mounting device 24, mark camera 26, component camera 28, component supply device 30, bulk component supply device 32, and control device 34 (see FIG. 3). Note that, as circuit substrate 12, a circuit board, a substrate having a three-dimensional structure, and the like are given as examples, and as the circuit board, a printed wiring board, a printed circuit board, and the like are given as examples.

Device main body 20 is configured by frame section 40 and beam section 42 mounted on frame section 40. Substrate conveyance and holding device 22 is disposed at the center in the front-rear direction of frame section 40, and includes conveyance device 50 and clamping device 52. Conveyance device 50 is a device for conveying circuit substrate 12, and clamping device 52 is a device for holding circuit substrate 12. Thus, substrate conveyance and holding device 22 conveys circuit substrate 12 and fixedly holds circuit substrate 12 at a predetermined position. In the following description, the conveying direction of circuit substrate 12 is referred to as the X direction, the horizontal direction perpendicular to the X direction is referred to as the Y direction, and the vertical direction is referred to as the Z direction. That is, the width direction of component mounting machine 10 is the X direction, and the front-rear direction is the Y direction.

Figure 2:
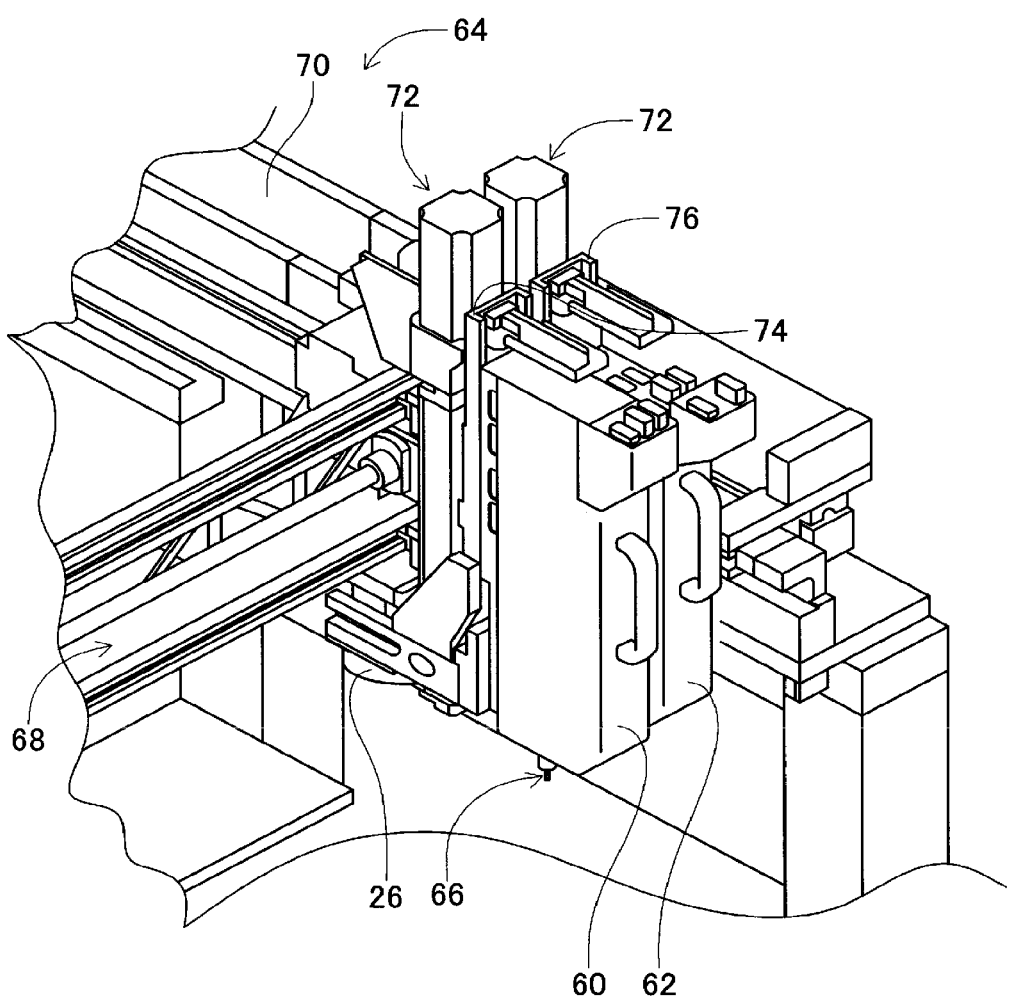
FIG. 2 is a perspective view showing a component mounting device of the component mounting machine.

Component mounting device 24 is disposed on beam section 42 and includes two work heads 60 and 62 and work head moving device 64. As shown in FIG. 2, suction nozzles 66 are provided on the lower end faces of work heads 60 and 62, and components are picked up by suction and held by suction nozzles 66. Work head moving device 64 includes X-direction moving device 68, Y-direction moving device 70, and Z-direction moving device 72. Two work heads 60 and 62 are integrally moved to any position on frame section 40 by X-direction moving device 68 and Y-direction moving device 70. Work heads 60 and 62 are detachably mounted on sliders 74 and 76 respectively, and Z-direction moving device 72 moves sliders 74 and 76 individually in the vertical direction. That is, work heads 60 and 62 are individually moved in the vertical direction by Z-direction moving device 72.

Mark camera 26 is attached to slider 74 in a state directed downward, and is moved together with work head 60 in the X direction, the Y direction, and the Z direction. As a result, mark camera 26 captures an image of a given position on frame section 40. As shown in FIG. 1, component camera 28 is disposed between substrate conveyance and holding device 22 on frame section 40 and component supply device 30, in a state facing upward. As a result, component camera 28 captures an image of components held by suction nozzles 66 of work heads 60 and 62.

Component supply device 30 is disposed at one end in the front-rear direction of frame section 40. Component supply device 30 includes tray-type component supply device 78 and feeder-type component supply device 80 (see FIG. 3). Tray-type component supply device 78 is a device for supplying a component on a tray. Feeder-type component supply device 80 is a device for supplying a component using a tape feeder or a stick feeder (not illustrated).

Bulk component supply device 32 is disposed at the other end in the front-rear direction of frame section 40. Bulk component supply device 32 is a device for aligning multiple scattered components and supplying the components in an aligned state. That is, this device aligns multiple components that are in an arbitrary orientation to a predetermined orientation and supplies the components in the predetermined orientation. Examples of components supplied by component supply device 30 and bulk component supply device 32 include electronic circuit components, solar cell components, power module components, and the like. Electronic circuit components include components having leads, components having no leads, and the like.

Control device 34 includes controller 82, multiple drive circuits 86, and image processing device 88. Multiple drive circuits 86 are connected to conveyance device 50, clamping device 52, work heads 60 and 62, work head moving device 64, tray-type component supply device 78, feeder-type component supply device 80, and bulk component supply device 32. Controller 82 includes a CPU, ROM, RAM, and the like, is mainly configured of a computer, and includes data storage area 96 and data analysis area 98. Data storage area 96 is an area for storing various data, and data analysis area 98 is an area for analyzing various data. Controller 82 is connected to multiple drive circuits 86. As a result, the operations of substrate conveyance and holding device 22, component mounting device 24, and the like are controlled by controller 82. Controller 82 is also connected to image processing device 88. Image processing device 88 processes image data obtained with mark camera 26 and component camera 28, and controller 82 acquires various information from the image data.

Operation of Component Mounting Machine

In component mounting machine 10, the mounting operation of components is performed on circuit substrate 12, which is held by substrate conveyance and holding device 22, with the above-described configuration. In particular, circuit substrate 12 is conveyed to a working position and fixedly held with clamping device 52 at this position. Next, mark camera 26 moves above circuit substrate 12 and captures an image of circuit substrate 12. As a result, information on the holding position and the like of circuit substrate 12 can be obtained. Component supply device 30 or bulk component supply device 32 supplies a component at a predetermined supply position. Either one of work heads 60, 62 moves above the component supply position and holds a component with suction nozzle 66. Subsequently, work head 60 or 62 holding the component moves above component camera 28, and the component held by suction nozzle 66 is imaged by component camera 28. In this way, information on the holding position and the like of the component can be obtained. Subsequently, work head 60 or 62 holding the component moves above circuit substrate 12 and corrects the error of the holding position of circuit substrate 12, the error of the holding position of the component, and the like. Then, suction nozzle 66 detaches the component, whereby the component is mounted on circuit substrate 12.

Recognition of Electrode Position of Component with Component Camera

As described above, in component mounter 10, since a component held by suction nozzle 66 is mounted on circuit substrate 12, information on the holding position and the like of the component held by suction nozzle 66 is acquired with component camera 28. In particular, when a component to be mounted on circuit substrate 12 is an electronic circuit component having a lead (hereinafter, sometimes referred to as a "lead component"), information on the position of the tip portion of the lead is acquired with component camera 28 in order to insert the lead into a through-hole formed in circuit substrate 12.

Figure 4:
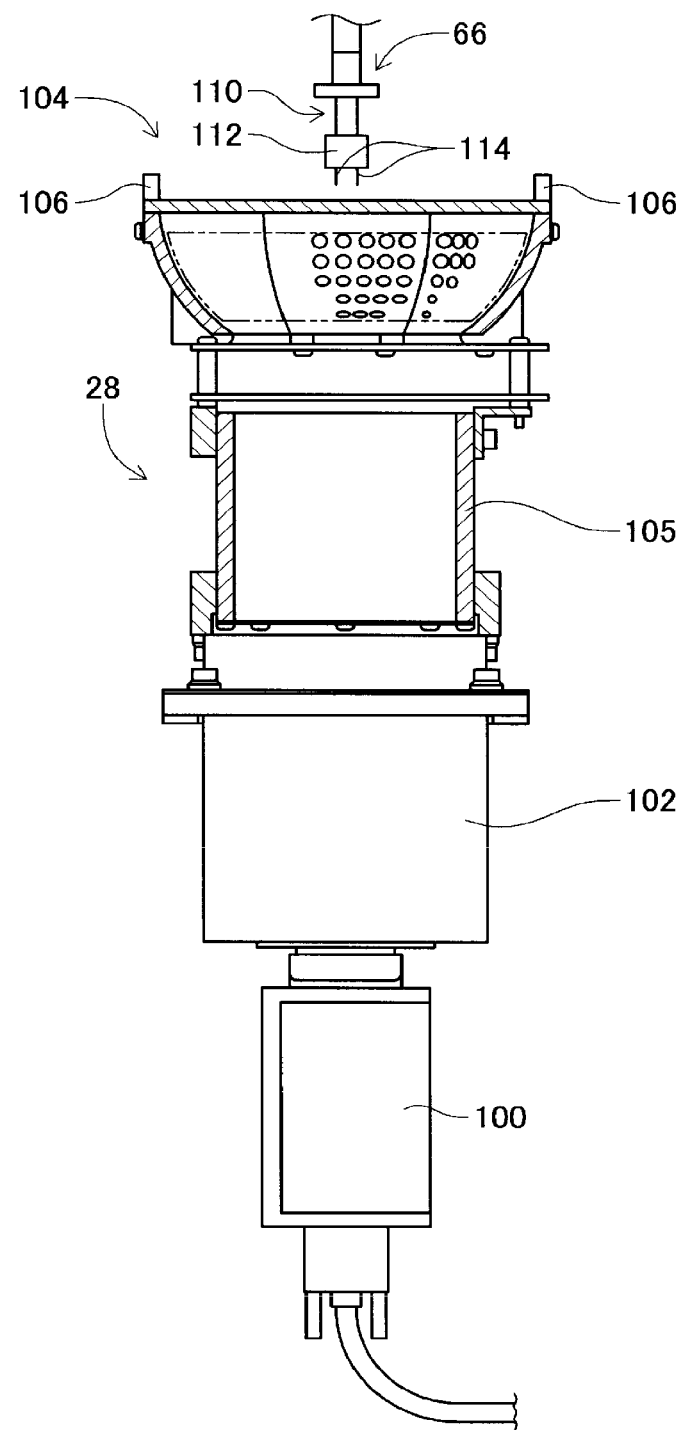
FIG. 4 is a schematic diagram showing a component camera.

More specifically, as shown in FIG. 4, component camera 28 includes imaging device 100, lens 102, and laser illuminator 104. Imaging device 100 includes an imaging element (not illustrated)) and is disposed with a light receiving surface facing upward. Lens 102 is fixed to the light-receiving surface side of imaging device 100, that is, the upper surface side in FIG. 4, and laser illuminator 104 is provided on lens 102 via box-shaped member 105 and the like. Laser illuminator 104 is configured with four laser irradiation devices (only two of which are shown in the FIG. 106. Four laser irradiation devices 106 are disposed at four equally-separated positions so as to surround lead component 110 held by suction nozzle 66. Four laser irradiation devices 106 irradiate laser light from four lateral positions toward lead component 110 held by suction nozzle 66. Lead component 110 includes component main body 112 and multiple leads 114 extending from the bottom surface of component main body 112, and component main body 112 is picked up by suction and held by suction nozzle 66 in a state in which leads 114 are directed downward. Further, since laser light is not diffused, each laser irradiation device 106 irradiates laser light in the form of a pinpoint toward the tip portion of lead component 110 held by suction nozzle 66.

The light irradiated from laser irradiation device 106 is reflected off lead 114 of lead component 110 held by suction nozzle 66, and falls on lens 102. The light incident on lens 102 enters imaging device 100, and is detected with the imaging element of imaging device 100. As a result, captured image data of the tip portion of lead 114 of lead component 110 held by suction nozzle 66 is obtained. Then, the position of the tip portion of lead 114 is recognized by analyzing the captured image data in data analysis area 98 of controller 82. In this manner, lead component 110 held by suction nozzle 66 is imaged by component camera 28, whereby a recognition process of the position of the tip portion of lead 114 (hereinafter, sometimes referred to as a "tip portion recognition process") can be appropriately performed.

Figure 5:
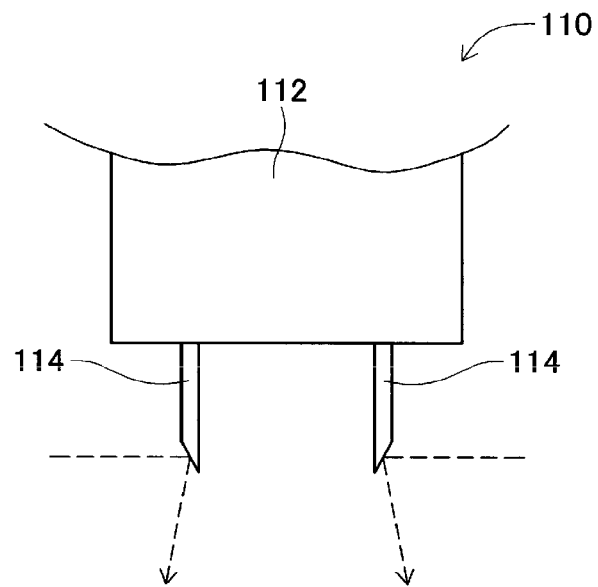
FIG. 5 is a schematic diagram showing a lead component having leads with a tapered shape.
Figure 6:
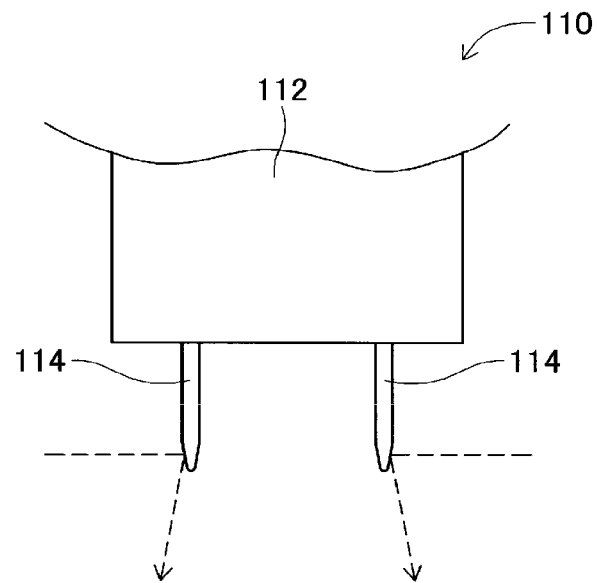
FIG. 6 is a schematic diagram showing a lead component having leads with a tapered shape.
Figure 7:
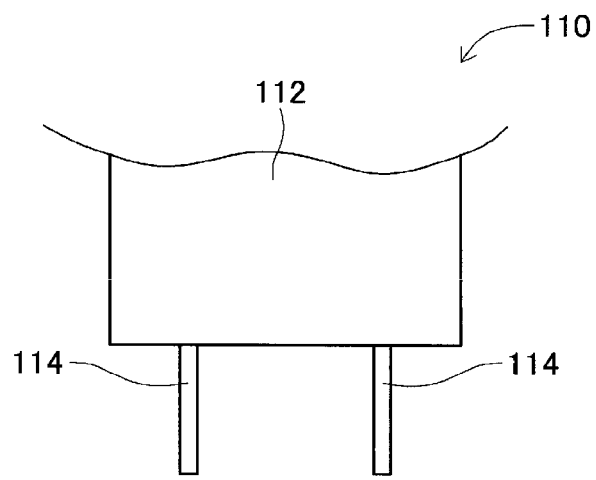
FIG. 7 is a schematic diagram showing a lead component having leads that are not tapered.

However, in component camera 28, laser light is irradiated from the side direction toward lead 114, and imaging is performed using the reflected light, but there is a fear that the exposure light amount of imaging device 100 is not stable due to variation in the tip shape of lead 114 and so the tip portion recognition process of lead 114 may not be appropriately performed. More specifically, as shown in FIG. 5, in some lead components 110, the tip portion of lead 114 has a tapered shape to facilitate insertion into through-holes of circuit substrate 12. When laser light is irradiated from the side direction on the tip of lead 114 having such a shape, a relatively large amount of light is reflected downward off the tip of lead 114. There is also lead component 110 having lead 114 with a tapered shape, for example, as shown in FIG. 6. When laser light is irradiated on the tip of lead 114 having such a shape from the side direction, the laser light is reflected downward by the tip of lead 114, but the reflection amount of the light by the tip of lead 114 shown in FIG. 5 differs from the reflection amount of the light by the tip of lead 114 shown in FIG. 6. Further, as shown in FIG. 7, there is also lead component 110 in which the tip of lead 114 is not tapered and the tip surface is perpendicular to the axial direction of lead 114. When the laser light is irradiated from the side direction on the tip of lead 114 having such a shape, the amount of light reflected downward off the tip of lead 114 is relatively small.

As described above, the amount of light reflected downward off the tip of lead 114 differs depending on the tip shape of lead 114. That is, the amount of light detected by the imaging element of imaging device 100 differs depending on the tip shape of lead 114. As a result, the exposure light amount of imaging device 100 is not stabilized according to the tip shape of lead 114, and there is a fear that the tip portion recognition process of lead 114 cannot be appropriately performed. Therefore, it is necessary to adjust the exposure light amount of imaging device 100, that is, the shutter speed (exposure time) of imaging device 100. In view of the above, in component mounting machine 10, the tip of lead 114 is imaged multiple times by changing the shutter speed of imaging device 100, and an optimum shutter speed is set based on multiple pieces of captured image data generated by the imaging.

More specifically, the imaging position of lead component 110 is set so that the laser light irradiated from laser irradiation device 106 is irradiated on the tip portion of lead 114 of lead component 110 which is held by suction nozzle 66. Specifically, in consideration of the length and the like of lead 114, data storage area 96 of controller 82 stores an imaging position (hereinafter referred to as "set imaging position") of lead component 110, that is, a position on the tip portion of lead 114 of lead component 110 held by suction nozzle 66 at which the laser light irradiated from laser irradiation device 106 is assumed to be irradiated. Then, lead component 110 held by suction nozzle 66 is moved to the set imaging position.

Next, the tip of lead 114 of lead component 110 moved to the set imaging position is imaged by component camera 28. At this time, the shutter speed is incremented from 50 to 110 msec and the tip of lead 114 is imaged multiple times. That is, with lead component 110 positioned at the set imaging position, the tip of lead 114 is imaged seven times at seven different shutter speeds of 50 msec, 60 msec, 70 msec, 80 msec, 90 msec, 100 msec, and 110 msec. Then, multiple pieces of captured image data with different shutter speeds are generated in data analysis area 98 of controller 82 by imaging the tip of lead 114 multiple times.

Figure 8:
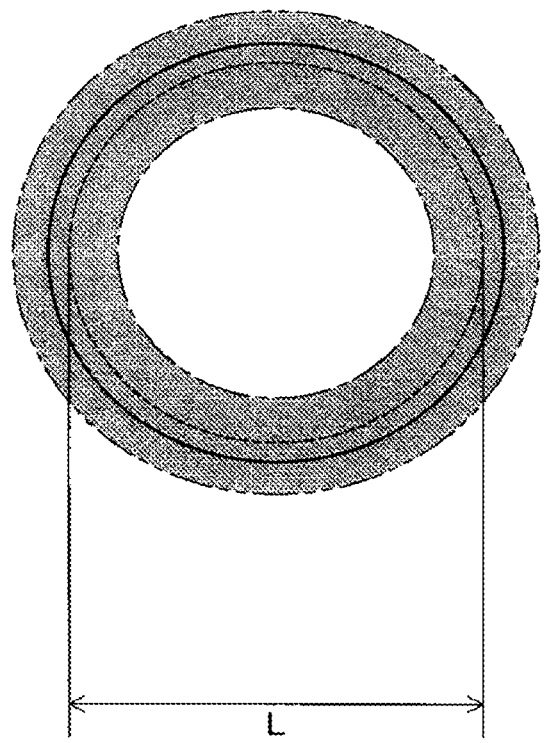
FIG. 8 is a conceptual view of an image in which the tip position of a lead is recognizable.

Next, whether the tip position of lead 114 can be appropriately recognized for each of multiple pieces of captured image data with different shutter speeds is determined in data analysis area 98. More specifically, data storage area 96 stores an image recognizable area corresponding to the wire diameter of lead 114. As shown in FIG. 8, the image recognizable area is a region enclosed by the smallest boundary line (dashed-dotted line), which is smaller than line diameter (dotted line) L of lead 114 by a predetermined distance, and the largest boundary line (dashed-two dotted line), which is larger than line diameter (dotted line) L of lead 114 by a predetermined distance, and is set in a state in which an allowable range for the predetermined width is added to line diameter L of lead 114.

Then, whether the external line of lead 114 falls within the image recognizable area in an image based on the captured image data is determined with data analysis area 98. At this time, as shown in FIG. 8, when the external line (solid line) of lead 114 falls within the image recognizable area, it is determined that the tip position of lead 114 can be appropriately recognized based on the captured image data. That is, by imaging lead 114 at the shutter speed corresponding to the captured image data, it is determined that the external line of lead 114 can be clearly recognized and the tip position of lead 114 can be appropriately recognized with an appropriate exposure light amount.

Figure 9:
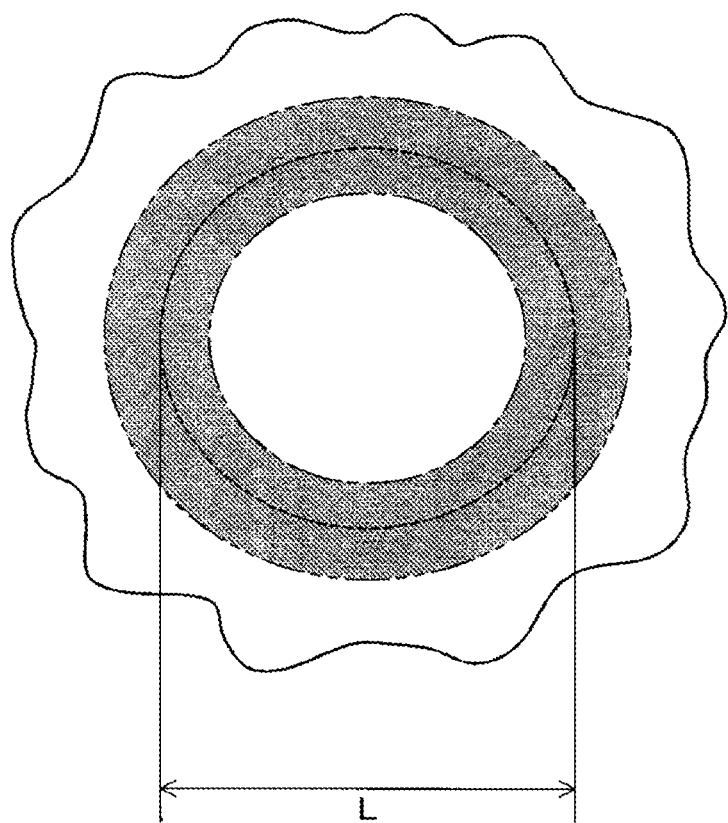
FIG. 9 is a conceptual view of an image in which the tip position of a lead cannot be recognized.
Figure 10:
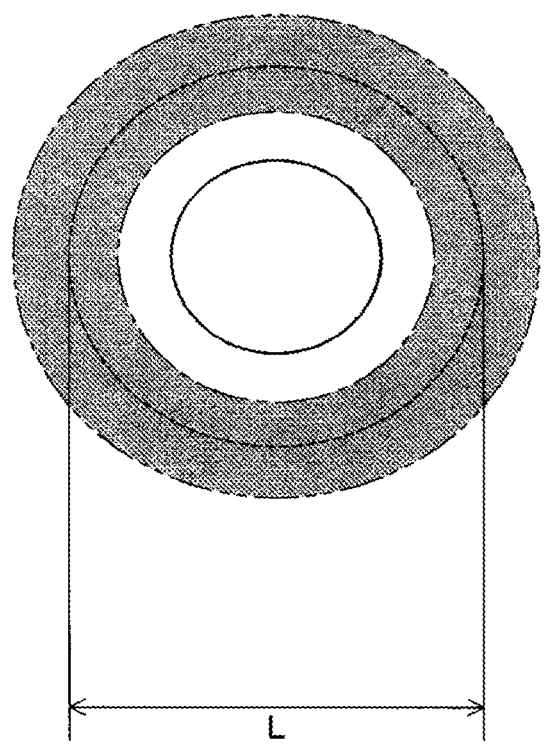
FIG. 10 is a conceptual view of an image in which the tip position of a lead cannot be recognized.

On the other hand, when the shutter speed corresponding to the captured image data is slow and the exposure light amount is large, halation occurs, and as shown in FIG. 9, the outer line (solid line) of lead 114 becomes blurred and unclear, and extends outside the maximum boundary line (dashed-two dotted line) of the image recognizable area, and does not fall within the image recognizable area. Therefore, in such a case, it is determined that the tip position of lead 114 cannot be properly recognized. When the shutter speed corresponding to the captured image data is high and the exposure light amount is small, the exposure is insufficient, and as shown in FIG. 10, the external line (solid line) of lead 114 becomes smaller than the minimum boundary line (dashed-dotted line) of the image recognizable area and does not fall within the image recognizable area. Therefore, also in such a case, it is determined that the tip position of lead 114 cannot be properly recognized.

Figure 11:
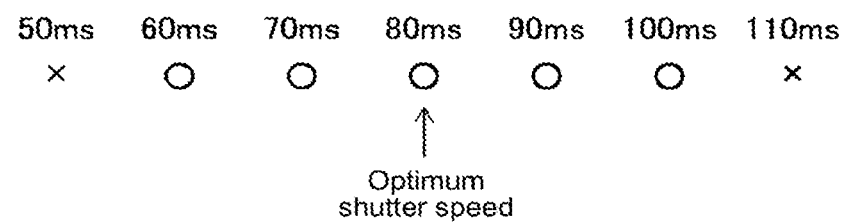
FIG. 11 is a diagram showing shutter speeds at the time of imaging when setting an optimum shutter speed.

When it is determined according to the above-described method whether the tip position of lead 114 can be appropriately recognized for each of multiple pieces of captured image data having different shutter speeds, an optimum shutter speed is set based on the determination result. Specifically, for example, as shown in FIG. 11, it is assumed that the tip position of lead 114 is determined to be recognizable by the captured image data at the shutter speeds of 60 to 100 msec, and that the tip position of lead 114 is determined to be unrecognizable by the captured image data at the shutter speeds of 50 msec and 110 msec. In FIG. 11, "X" is written in the shutter speed at which the tip position of lead 114 is determined to be unrecognizable, and "○" is written in the shutter speed at which the tip position of lead 114 is determined to be recognizable.

Of the shutter speeds determined to be viable for recognizing the tip position of lead 114, the average value (80 msec) of the fastest shutter speed (hereinafter referred to as a "recognizable upper-limit shutter speed") (60 msec) and the slowest shutter speed (hereinafter referred to as a "recognizable lower-limit shutter speed") (100 msec) is set as the optimum shutter speed. As a result, irrespective of the tip shape of lead 114, it is possible to suppress the variation of the exposure light amount of imaging device 100, and to appropriately perform the tip portion recognition process of lead 114.

Note that the shutter speed that is changed when the optimum shutter speed is set need not be in the range from 50 to 110 msec but can be set to any range in accordance with the luminous intensity of laser irradiation device 106, the performance of imaging device 100, or the like. Further, the interval of the shutter speed which is changed when the optimum shutter speed is set can also be set to any interval instead of an interval of every 10 msec. The optimum shutter speed can be set to any value other than the average value of the shutter speeds that are determined to be recognizable.

Figure 12:
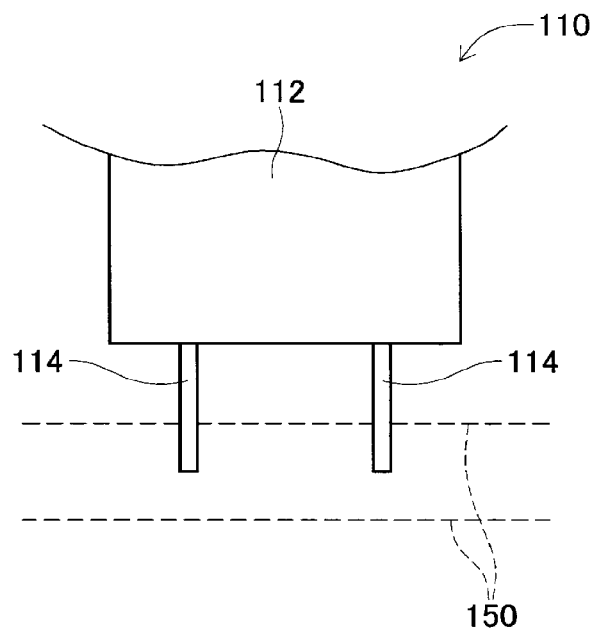
FIG. 12 is a schematic diagram showing a state in which laser light is irradiated toward the leads of a lead component.

In addition, in component mounter 10, not only the shutter speed of imaging device 100 but also the imaging position in the vertical direction of lead component 110 held by suction nozzle 66 is optimized, whereby appropriate execution of the tip portion recognition process of lead 114 is ensured. More specifically, since the laser light irradiated on the tip of lead 114 of lead component 110 does not diffuse, as shown in FIG. 12, the laser light is irradiated toward lead component 110 along a light path having a predetermined width (a path between two dotted lines 150). At this time, when the tip portion of lead 114 is located inside the light path as shown in FIG. 12, the light is reflected at the tip portion of lead 114, so that the tip portion of lead 114 is imaged. In such a case, the tip portion recognition process of lead 114 can be performed appropriately.

Figure 13:
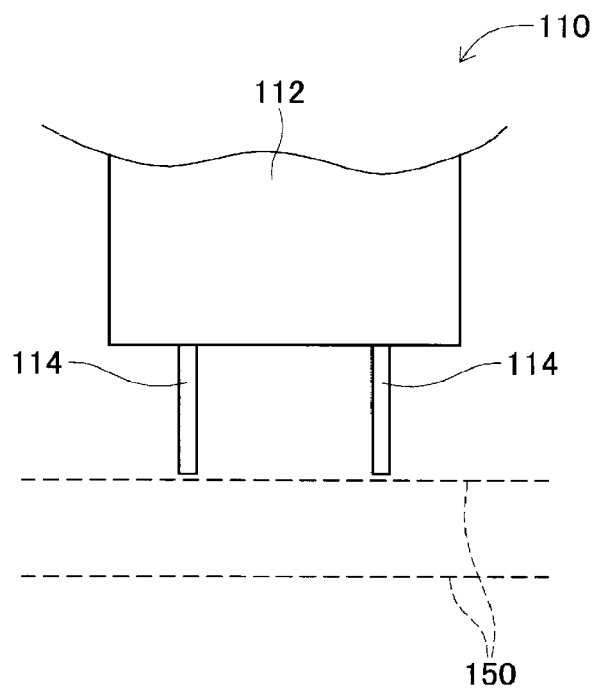
FIG. 13 is a schematic diagram showing a state in which laser light is irradiated toward the leads of a lead component.
Figure 14:
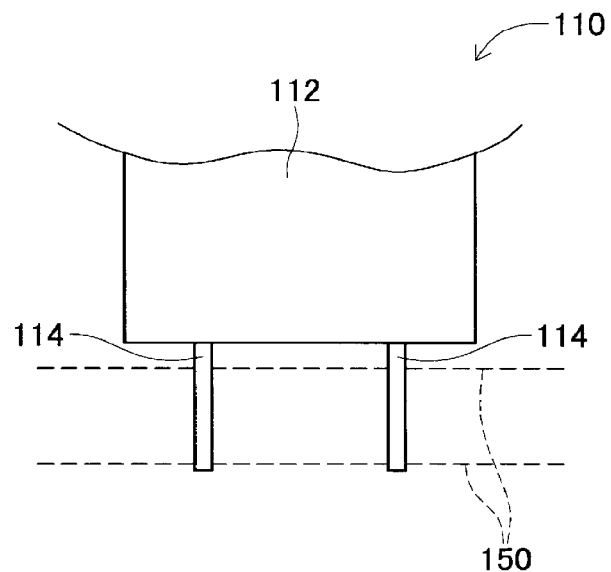
FIG. 14 is a schematic diagram showing a state in which laser light is irradiated toward the leads of a lead component.

On the other hand, when the tip portion of lead 114 is located above the light path of the laser light as shown in FIG. 13, the light is not irradiated on the tip portion of the lead 114, resulting in a state in which the tip portion of lead 114 cannot be imaged. In such a case, the tip portion recognition process of lead 114 cannot be performed. When the tip portion of lead 114 is located below the light path of the laser light as shown in FIG. 14, the light is irradiated on the proximal end of lead 114 on component main body 112 side but not on the tip portion of lead 114, resulting in a state in which the tip portion of lead 114 cannot be imaged. Also, in such a case, the tip portion recognition process of lead 114 cannot be performed.

Therefore, during imaging of lead component 110, it is necessary to set the imaging position of lead component 110 so that the tip portion of lead 114 is located inside the irradiation width of the laser light. However, even when the imaging position is set so that the tip portion of lead 114 is located inside the irradiation width of the laser light, the tip portion recognition process of lead 114 may not be performed due to the error in the length of lead 114.

Specifically, even for the same type of lead component, there is an error, although being small, in the length of the lead. In particular, in the case of a lead component supplied with an axial feeder, the error in the length of the lead may be large. An axial feeder is a feeder that cuts the leads of an axial-type lead component to a predetermined length and supplies the lead component with the leads in a bent state. In a lead component supplied with such an axial feeder, the error in the length of the lead may be large depending on the diameter, the material, and the like of the lead.

As described above, when there is an error in the length of the lead, even if the imaging position of lead component 110 is set so that the tip portion of lead 114 is located inside the irradiation width of the laser light, the tip portion recognition process may not be performed depending on the length of the lead. More specifically, for example, when the imaging position of lead component 110 is set at the position shown in FIG. 15, that is, when the imaging position of lead component 110 is set so that the tip portion of lead 114 is located near the upper limit inside of the laser light irradiation width, the light is irradiated on the tip portion of lead 114 when lead 114 has a normal length. On the other hand, when the length of lead 114 is short due to an error, even if the imaging position of lead component 110 is the same as the imaging position of FIG. 15, as shown in FIG. 13, the tip portion of lead 114 is located above the laser light irradiation width, and the light is not irradiated on the tip portion of lead 114. In such a case, the tip portion recognition process cannot be performed.

Figure 16:
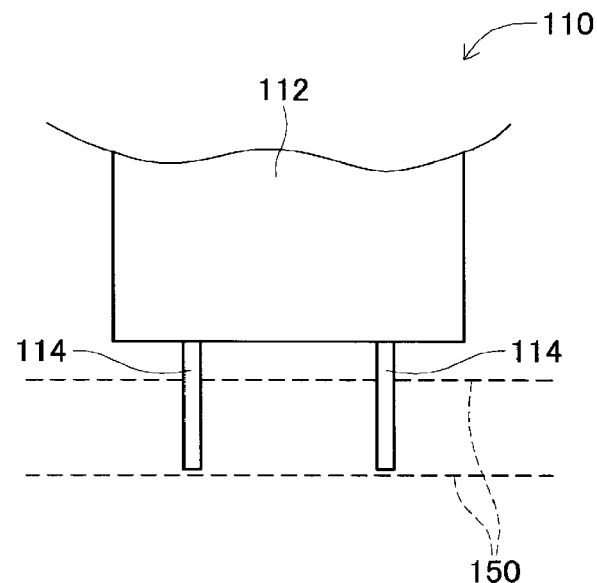
FIG. 16 is a schematic diagram showing a state in which laser light is irradiated toward the lead of a lead component.

In addition, for example, when the imaging position of lead component 110 is set at the position shown in FIG. 16, that is, when the imaging position of lead component 110 is set so that the tip portion of lead 114 is located near the lower limit inside of the laser light irradiation width, the light is irradiated on the tip portion of lead 114 when lead 114 has a normal length. On the other hand, when the length of lead 114 is long due to an error, even if the imaging position of lead component 110 is the same as the imaging position of FIG. 16, as shown in FIG. 14, the tip portion of lead 114 is located below the laser light irradiation width, and the light is not irradiated on the tip portion of lead 114. Also, in such a case, the tip portion recognition process cannot be performed.

In view of the above, in component mounting machine 10, the imaging position of lead component 110 is set so that the tip portion of lead 114 is located at the center of the inside of the laser light irradiation width. Specifically, a position higher than the set imaging position, which is used upon setting the optimum shutter speed, by a set distance (0.5 mm in this embodiment) (hereinafter, sometimes referred to as an "upper imaging position") is set as an upper limit imaging position, and a position lower than the set imaging position by the set distance (0.5 mm in this embodiment) (hereinafter, sometimes referred to as a "lower imaging position") is set as a lower limit imaging position. When suction nozzle 66 holding lead component 110 is moved downward from the upper imaging position toward the lower imaging position, the imaging is performed with component camera 28 at every preset pitch (0.1 mm in this embodiment).

Figure 17:
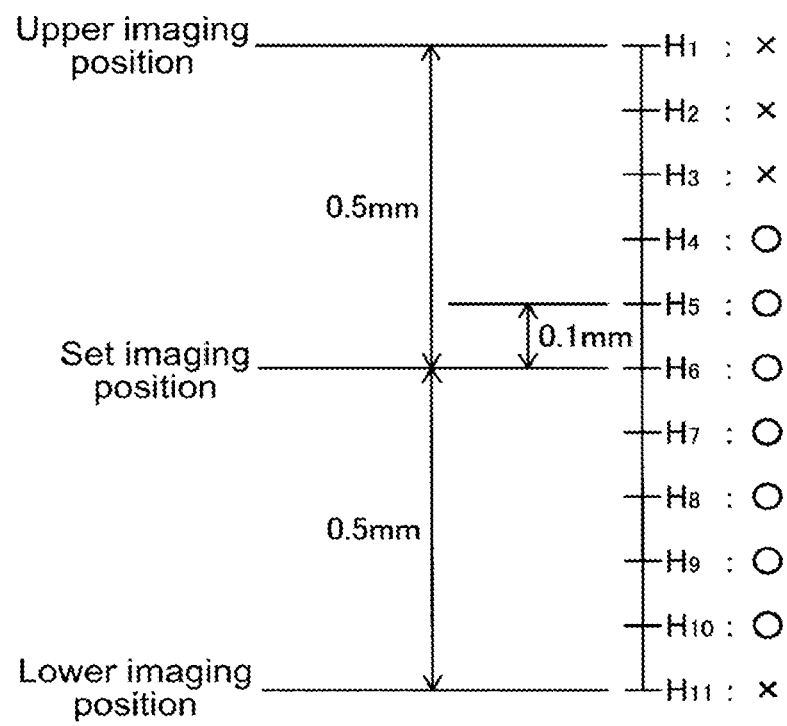
FIG. 17 is a diagram conceptually showing imaging positions of a first embodiment.

That is, for example, as shown in FIG. 17, a position above the set imaging position by 0.5 mm is set as the upper imaging position, and a position below the set imaging position by 0.5 mm is set as the lower imaging position. The imaging positions are set at intervals of 0.1 mm between the upper imaging position and the lower imaging position. As a result, eleven imaging positions $H_1$ to $H_{11}$ are set in order from the top. When the imaging positions are set in this manner, suction nozzle 66 holding lead component 110 is moved from upper imaging position ($H_1$) to lower imaging position ($H_{11}$), and the imaging is performed with component camera 28 at each imaging position.

When lead component 110 is imaged in accordance with the above procedure, captured image data corresponding to each imaging is generated in data analysis area 98 of controller 82. In other words, pieces of captured image data at individual imaging positions ($H_1$ to $H_{11}$) are generated. Then, it is determined in data analysis area 98 whether the tip portion of lead 114 is recognizable for each of the pieces of captured image data at multiple imaging positions H1 to $H_{11}$. In this case, for example, it is assumed that the determination is made that the tip portion of lead 114 cannot be recognized in each piece of the imaging data at imaging positions ($H_1$ to $H_3$, $H_{11}$) and that the tip portion of lead 114 is recognizable in each piece of the imaging data at imaging positions ($H_4$ to $H_{10}$). In FIG. 17, "X" is written in imaging positions ($H_1$ to $H_3$, $H_{11}$) at which the tip portion of lead 114 is determined to be unrecognizable, and "○" is written in imaging positions ($H_4$ to $H_{10}$) at which the tip portion of lead 114 is determined to be recognizable.

As described above, when it is determined whether the tip portion of lead 114 is recognizable for each imaging position, the central position among imaging positions ($H_4$ to $H_{10}$) at which the tip portion of lead 114 is determined to be recognizable is set as the optimum imaging position. That is, imaging position ($H_7$) at the center between imaging position ($H_4$) at the top of imaging positions ($H_4$ to $H_{10}$) where the tip portion of lead 114 is determined to be recognizable (hereinafter referred to as a "recognition upper limit position") and imaging position ($H_{10}$) at the bottom of imaging positions ($H_4$ to $H_{10}$) where the tip portion of lead 114 is determined to be recognizable (hereinafter referred to as a "recognition lower limit position") is set as the optimum imaging position.

Figure 15:
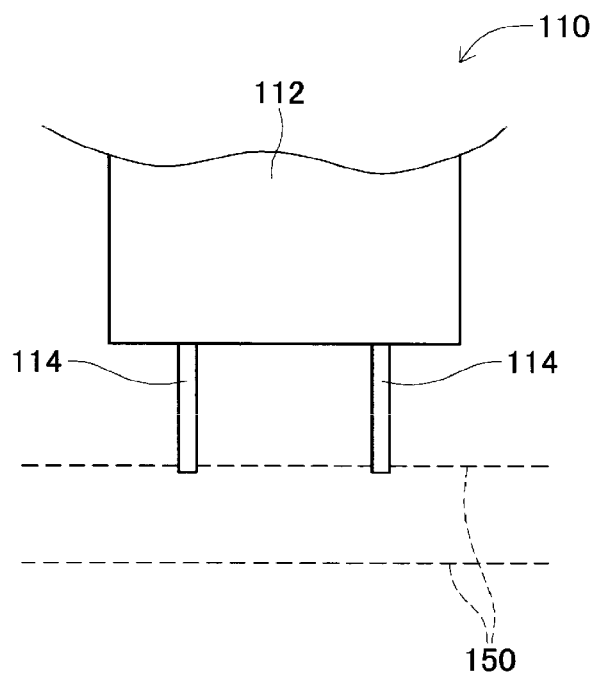
FIG. 15 is a schematic diagram showing a state in which laser light is irradiated toward the leads of a lead component.

That is, in a case where lead component 110 is located at recognition upper limit position ($H_4$) when suction nozzle 66 holding lead component 110 is moved from imaging upper limit position ($H_1$) to imaging lower limit position ($H_{11}$), the tip portion of lead 114 is located near the upper limit inside of the laser light irradiation width, as shown in FIG. 15. When lead component 110 is located at recognition lower limit position $H_{10}$, as shown in FIG. 16, the tip portion of lead 114 is located near the lower limit inside of the laser light irradiation width. Therefore, when lead component 110 is located at imaging position ($H_7$) at the center between recognition upper limit position ($H_4$) and recognition lower limit position ($H_{10}$), as shown in FIG. 12, the tip portion of lead 114 is located substantially at the center inside of the laser light irradiation width. As a result, it is possible to set imaging position ($H_7$) as the optimum imaging position when the tip portion of lead 114 is located substantially at the center inside of the laser light irradiation width.

The set distance for setting the upper imaging position and the lower imaging position when setting the optimum imaging position can be set freely in accordance with the laser light irradiation width. The imaging pitch when resetting the optimum imaging position can also be set to any value, but is preferably set to about 0.1 to 0.5 mm in consideration of the number of imagings, accuracy, and the like.

Further, in the above description, although the tip portion recognition process of lead 114 is appropriately performed at all the imaging positions between the recognition upper limit position and the recognition lower limit position, the tip portion recognition process of lead 114 may not be appropriately performed at at least one imaging position between the recognition upper limit position and the recognition lower limit position. Such a phenomenon occurs, for example, due to reflection of laser light by foreign matter or the like attached to lead 114 or the like.

Figure 18:
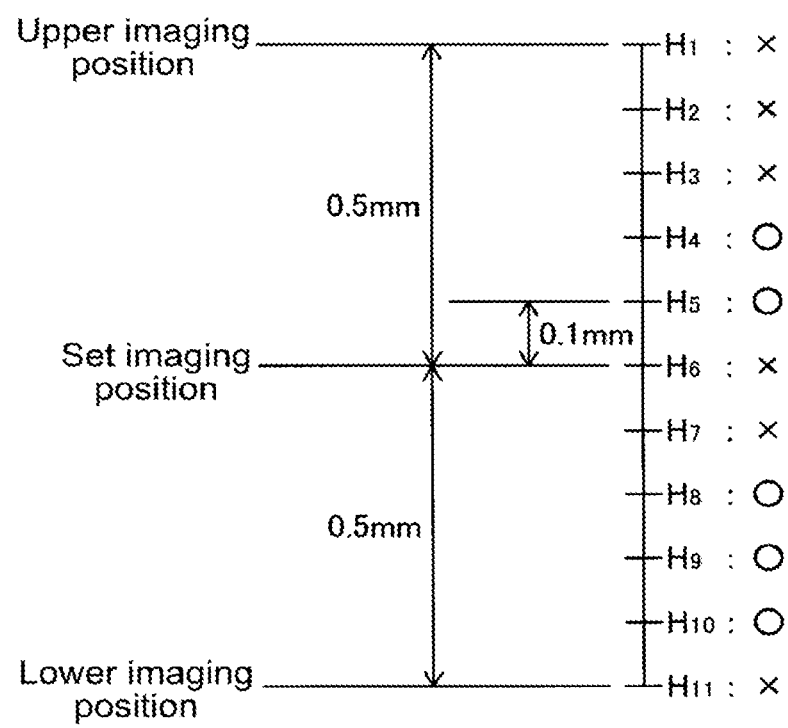
FIG. 18 is a diagram conceptually showing imaging positions of the first embodiment.

Specifically, for example, as shown in FIG. 18, it may be determined that the tip portion of lead 114 cannot be recognized in each piece of the captured image data at imaging positions ($H_1$ to $H_3$, $H_6$, $H_7$, and $H_{11}$), and that the tip portion of lead 114 is recognizable in each piece of the captured image data at imaging positions ($H_4$, $H_5$, $H_8$ to $H_{10}$). That is, in some cases, the tip portion recognition process of lead 114 cannot be appropriately performed at imaging positions ($H_6$, $H_7$) between recognition upper limit position ($H_4$) and recognition lower limit position ($H_{10}$).

In this case, imaging position ($H_9$) at the center between imaging position ($H_8$), which is below imaging positions ($H_6$, $H_7$) that are positions located between recognition upper limit position ($H_4$) and recognition lower limit position ($H_{10}$) at which tip portion recognition process cannot be performed, and recognition lower limit position ($H_{10}$) is set as the optimum imaging position. Thus, it is possible to perform a tip portion recognition process based on image data captured when the tip portion of lead 114 is located at the lower portion inside of the laser light irradiation width, that is, image data captured in a state in which the laser light is irradiating most of lead 114 including the tip, and the position of the tip portion of lead 114 can be appropriately recognized.

The set optimum imaging position may be different from the set imaging position at which lead 114 was imaged when setting the optimum shutter speed. In such a case, the optimum shutter speed set at the set imaging position may not be suitable when performing imaging at the optimum imaging position. Therefore, when the set optimum imaging position is different from the set imaging position at which lead 114 was imaged when setting the optimum shutter speed, the optimum shutter speed is set again at the optimum imaging position. That is, in a state in which lead component 110 held by suction nozzle 66 is moved to the optimum imaging position, the tip of lead 114 is imaged multiple times by changing the shutter speed of imaging device 100, and the optimum shutter speed is reset based on the multiple pieces of captured image data generated by the imaging. This makes it possible to ensure the optimization of the shutter speed at the optimum imaging position. Since the setting of the optimum shutter speed at the set imaging position and the resetting of the optimum shutter speed at the optimum imaging position are performed by the same method, the description of the resetting of the optimum shutter speed at the optimum imaging position is omitted.

Figure 3:
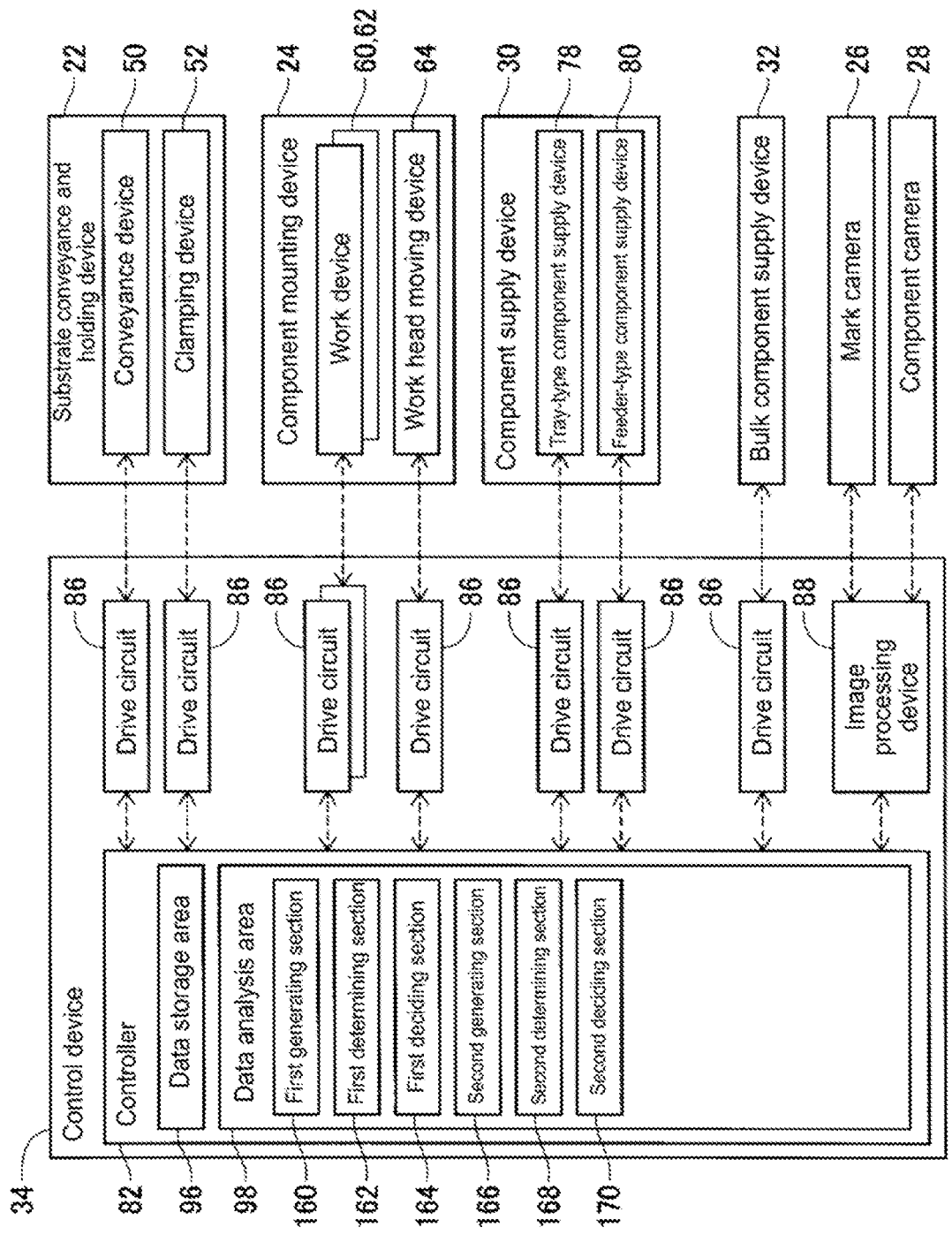
FIG. 3 is a block diagram showing a control device provided in the component mounting machine.

As shown in FIG. 3, data analysis area 98 of controller 82 includes first generating section 160, first determining section 162, first deciding section 164, second generating section 166, second determining section 168, and second deciding section 170. First generating section 160 is a functional section for generating pieces of captured image data of different shutter speeds. First determining section 162 is a functional section for determining whether the position of the tip portion of lead 114 is recognizable based on each piece of captured image data of the different shutter speeds. First deciding section 164 is a functional section for deciding the optimum shutter speed based on the determination result of first determining section 162. Second generating section 166 is a functional section for generating captured image data for each imaging position. Second determining section 168 is a functional section for determining whether the position of the tip portion of lead 114 is recognizable based on the captured image data for each imaging position. Second deciding section 170 is a functional section for deciding the optimum imaging position based on the determination result of second determining section 168.

Second Embodiment

In component mounting machine 10 of the first embodiment, multiple imaging positions are set downward in order from the upper imaging position to the lower imaging position, but in component mounting machine 10 of the second embodiment, with a set imaging position as the center, positions sequentially departing from the set imaging position are set as multiple imaging positions.

Figure 19:
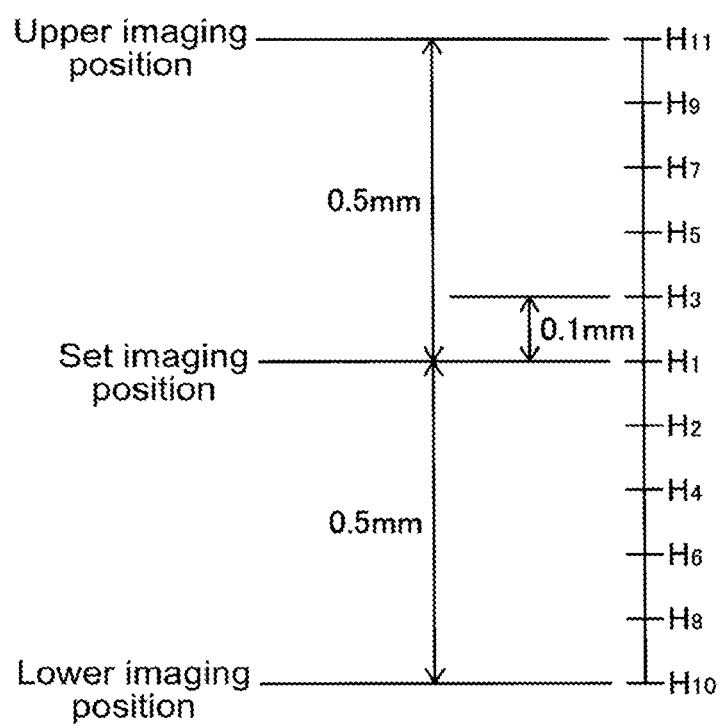
FIG. 19 is a diagram conceptually showing imaging positions of a second embodiment.

Specifically, as shown in FIG. 19, the set imaging position used upon setting the optimum shutter speed is set as first imaging position ($H_1$). Then, second imaging position ($H_2$) is set to an imaging position which is separated downward from the set imaging position by a distance corresponding to a set pitch (0.1 mm in this embodiment). Next, third imaging position (H3) is set to an imaging position which is separated upward from the set imaging position by a distance corresponding to the set pitch (0.1 mm in this embodiment). Further, fourth imaging position (H4) is set to an imaging position which is separated downward from the set imaging position by a distance corresponding to twice the set pitch is set, and fifth imaging position ($H_5$) is set to an imaging position that is separated upward from the set imaging position by a distance corresponding to twice the set pitch. That is, the 2N-th (N: positive integer) imaging position ($H_{2N}$) is set to an imaging position which is separated downward from the set imaging position by a distance corresponding to (set pitch×N), and (2N+1)-th imaging position ($H_{2N+1}$) is set to an imaging position which is separated upward from the set imaging position by a distance corresponding to (set pitch×N). Note that the upper limit imaging position separated upward from the set imaging position, that is, the upper imaging position, is a position separated upward from the set imaging position by the set distance (0.5 mm in this embodiment) as in the first embodiment. In addition, the lower limit imaging position separated downward from the set imaging position, that is, the lower imaging position, is a position separated downward from the set imaging position by the set distance (0.5 mm in this embodiment) as in the first embodiment. Thus, in the example shown in FIG. 19, eleven imaging positions $H_1$ to $H_{11}$ are set.

When the imaging positions are set as described above, lead component 110 is moved to imaging position $H_1$ and imaged by component camera 28. Then, the tip portion recognition process of lead 114 is performed based on the captured image data generated by the imaging. At this time, when the position of the tip portion of lead 114 is recognized based on the captured image data, imaging position ($H_1$) of the captured image data used in the recognition process is set as the optimum imaging position. On the other hand, when the position of the tip portion of lead 114 is not recognized based on the captured image data, lead component 110 is moved to next imaging position $H_2$, and the tip portion recognition process is performed based on the captured image data at this imaging position. At this time, when the position of the tip portion of lead 114 is recognized based on the captured image data, imaging position ($H_2$) of the captured image data used in the recognition process is reset as the optimum imaging position. On the other hand, when the position of the tip portion of lead 114 is not recognized based on the captured image data, lead component 110 is moved to next imaging position ($H_3$), and the tip portion recognition process is performed based on the captured image data at this imaging position. That is, lead component 110 is moved to the next imaging position until the position of the tip portion of lead 114 is recognized based on the captured image data, and the tip portion recognition process is performed based on the captured image data at this imaging position.

More specifically, for example, when lead component 110 is moved to each of five imaging positions ($H_1$ to $H_5$) in order, and the position of the tip portion of lead 114 is not recognized based on the captured image data at each imaging position, lead component 110 is moved to imaging position ($H_6$) and the tip portion recognition process is performed based on the captured image data at this imaging position. At this time, when the position of the tip portion of lead 114 is recognized based on the captured image data at imaging position ($H_6$), imaging position ($H_6$) is reset as the optimum imaging position. Then, imaging at imaging positions ($H_7$ to $H_{11}$) is not performed, and the tip portion recognition process based on the captured image data at imaging positions ($H_7$ to $H_{11}$) is also not performed.

By setting the optimum imaging position in this manner, the imaging position, when the tip portion of lead 114 is located near the center of the inside of the laser light irradiation width, can be set as the optimum imaging position. This makes it possible to achieve the same effect as that of the first embodiment.

It should be noted that the present disclosure is not limited to the above-mentioned embodiments, and can be implemented in various modes in which various modifications and improvements are made based on the knowledge of a person skilled in the art. Specifically, for example, in an above embodiment, the present disclosure is applied to the recognition process of the position of the tip portion of lead 114 of lead component 110, but the present disclosure can be applied to the recognition process of the position of an electrode, e.g., a bump, of an electronic circuit component having no leads. Further, the present disclosure can be applied to the recognition process of the position of not only an electrode of an electronic circuit component but also the tip portion of a protruding section of a component. Furthermore, the present disclosure can be applied to the recognition process of not only the protruding section of a component but also the characteristic section of a component, for example, a portion which does not protrude but is electrically connectable.

In the first embodiment, the average value of the recognition upper limit shutter speed and the recognition lower limit shutter speed is set as the optimum shutter speed, but any shutter speed between the recognition upper limit shutter speed and the recognition lower limit shutter speed can be set as the optimum shutter speed.

In the first embodiment, the intervals of the different shutter speeds are fixed, but the intervals of the different shutter speeds can be set freely. That is, for example, the shutter speeds used upon setting the optimum shutter speed can be 50 msec, 55 msec, 65 msec, 80 msec, 95 msec, 105 msec, and 110 msec. In this manner, by decreasing the interval between the shutter speeds as the shutter speed increases or decreases, it is possible to finely confirm the shutter speed at which the position of the tip of lead 114 cannot be recognized.

When the optimum imaging position is set, in the first embodiment, lead component 110 is moved from the upper imaging position to the lower imaging position, but lead component 110 may be moved from the lower imaging position to the upper imaging position.

In the first embodiment, the center position between the recognition upper limit position and the recognition lower limit position is set as the optimum imaging position, but any position between the recognition upper limit position and the recognition lower limit position can be set as the optimum imaging position.

Further, in the first embodiment, in the case where the tip portion recognition process of lead 114 cannot be appropriately performed in at least one imaging position between the recognition upper limit position and the recognition lower limit position, a position between the recognition lower limit position and an imaging position, which is located between the recognition upper limit position and the recognition lower limit position and located below the imaging position where the tip portion recognition process cannot be performed, is set as the optimum imaging position, but a position between the recognition upper limit position and an imaging position, which is located between the recognition upper limit position and the recognition lower limit position and located above the imaging position where the tip portion recognition process cannot be performed, may be set as the optimum imaging position.

The present disclosure can be applied not only to axial components but also to radial components, bulk supply components, and the like.

REFERENCE SIGNS LIST

28: component camera (recognition device), 98: data analysis area (data analysis device), 100: Imaging device, 104: laser illuminator (light source), 110: lead component (component), 114: lead (characteristic section) (protruding section), 160: first generating section, 162: first determining section, 164: first deciding section, 166: second generating section, 168: second determining section, 170: second deciding section

The invention claimed is:

1. A recognition device for recognizing a position of a characteristic section of a component to be mounted on a board, the recognition device comprising:
a light source configured to irradiate light on the characteristic section of the component;
an imaging device configure to image the characteristic section of the component based on the irradiated light when light from the light source is irradiated on the characteristic section of the component; and
a data analysis device configured to recognize a position of the characteristic section of the component imaged by the imaging device based on captured image data imaged by the imaging device,
wherein the data analysis device further comprises:
a first generating section configured to image the characteristic section of a target component that is an imaging target of the imaging device multiple times at different shutter speeds using the imaging device, in a state in which the target component is located at an imaging position set in advance, and configured to generate multiple pieces of captured image data corresponding to the multiple imagings;
a first determining section configured to determine whether the position of the characteristic section of the target component is recognizable based on each of the multiple pieces of captured image data generated by the first generating section;
a first deciding section configured to decide, as an optimum shutter speed, a shutter speed between a first shutter speed, which is a fastest shutter speed among the shutter speeds during imaging corresponding to the captured image data for which the first determining section determined that the position of the characteristic section of the target component was recognizable, and a second shutter speed, which is a slowest shutter speed among the shutter speeds during imaging corresponding to the captured image data for which the first determining section determined that the position of the characteristic section of the target component was recognizable;
a second generating section configured to image the characteristic section of the target component using the imaging device at the optimum shutter speed at each interval of a preset pitch, in a case where a position above the set imaging position is defined as an upper set position and a position below the set imaging position is defined as a lower set position, when the target component moves from one of the upper set position and the lower set position toward the other, and generate a piece of captured image data for each of the pitch intervals;

a second determining section configured to determine whether the position of the characteristic section of the target component is recognizable based on the piece of captured image data for each pitch interval generated by the second generating section; and a second deciding section configured to decide, as an optimum imaging position, among imaging positions of the target component during imaging corresponding to the pieces of captured image data which are determined by the second determining section to be viable for recognizing the position of the characteristic section of the target component, a position between a recognition upper limit position that is a position closest to the upper set position and a recognition lower limit position that is a position closest to the lower set position.

2. The recognition device according to claim 1, wherein the first deciding section decides an average value of the first shutter speed and the second shutter speed to be the optimum shutter speed.

3. The recognition device according to claim 1, wherein, in a case where the pieces of captured image data at the imaging positions between the recognition upper limit position and the recognition lower limit position include a piece of captured image data which the second determining section determines not to be viable for recognizing the position of the characteristic section of the target component, the second deciding section decides a position, which is located between the imaging position below the imaging position corresponding to the determined piece of captured image data and the recognition lower limit position, to be the optimum imaging position.

4. A recognition device for recognizing a position of a characteristic section of a component to be mounted on a board, the recognition device comprising:

a light source configured to irradiate light on the characteristic section of the component;

an imaging device configure to image the characteristic section of the component based on the irradiated light when light from the light source is irradiated on the characteristic section of the component; and a data analysis device configured to recognize a position of the characteristic section of the component imaged by the imaging device based on captured image data imaged by the imaging device, wherein the data analysis device further comprises:

a first generating section configured to image the characteristic section of a target component that is an imaging target of the imaging device multiple times at different shutter speeds using the imaging device, in a state in which the target component is located at an imaging position set in advance, and configured to generate multiple pieces of captured image data corresponding to the multiple imagings;

a first determining section configured to determine whether the position of the characteristic section of the target component is recognizable based on each of the multiple pieces of captured image data generated by the first generating section;

a first deciding section configured to decide, as an optimum shutter speed, a shutter speed between a first shutter speed, which is a fastest shutter speed among the shutter speeds during imaging corresponding to the captured image data for which the first determining section determined that the position of the characteristic section of the target component was recognizable, and a second shutter speed, which is a slowest shutter speed among the shutter speeds during imaging corresponding to the captured image data for which the first determining section determined that the position of the characteristic section of the target component was recognizable;

a second generating section configure to image the characteristic section of the target component at the optimum shutter speed with the imaging device in a state in which the target component is located at a predetermined position, and generate captured image data;

a second determining section configured to determine whether the position of the characteristic section of the target component is recognizable based on the captured image data generated by the second generating section; and a second deciding section configured to decide the imaging position when the position of the characteristic section of the target component is determined to be recognizable by the second determining section, the imaging position being a position of the target component during imaging corresponding to the captured image data, to be an optimum imaging position, wherein the second generating section performs imaging multiple times until the second determining section determines that the position of the characteristic section of the target component is recognizable based on the captured image data generated by the second generating section in a manner that, in a first imaging, the characteristic section of the target component located at the set imaging position is imaged, in a 2N-th imaging (N: positive integer), the characteristic section of the target component located at a position separated in one of upper and lower directions from the set imaging position by a distance corresponding to (set distance×N) is imaged, and in a (2N+1)-th imaging, the characteristic section of the target component located at a position separated in the other of upper and lower directions from the set imaging position by the distance corresponding to (set distance×N) is imaged, and wherein the second determining section determines whether the position of the characteristic section of the target component is recognizable based on the captured image data generated by the second generating section each time the second generating section generates the captured image data.

5. The recognition device according to claim 1, wherein, in a case where the optimum imaging position decided by the second deciding section is different from the set imaging position, the first generating section images the characteristic section of the target component multiple times at different shutter speeds with the imaging device in a state in which the target component is located at the optimal imaging position, and generates multiple pieces of captured image data corresponding to the multiple imagings, and wherein the first determining section determines again whether the position of the characteristic section of the target component is recognizable and the first deciding section decides again the optimum shutter speed.

6. The recognition device according to claim 1, wherein the characteristic section of the component is a protruding section of the component.

* * * * *